(12) United States Patent
Park

(10) Patent No.: US 7,212,439 B2
(45) Date of Patent: May 1, 2007

(54) NAND FLASH MEMORY DEVICE AND METHOD OF PROGRAMMING THE SAME

(75) Inventor: Jin Su Park, Daegu-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 300 days.

(21) Appl. No.: 10/888,067

(22) Filed: Jul. 9, 2004

(65) Prior Publication Data

US 2005/0232012 A1 Oct. 20, 2005

(30) Foreign Application Priority Data

Apr. 19, 2004 (KR) ................. 10-2004-0026766

(51) Int. Cl.
*G11C 16/04* (2006.01)
(52) U.S. Cl. .................. 365/185.11; 365/185.12; 365/185.17; 365/185.25; 365/185.28
(58) Field of Classification Search .......... 365/185.11, 365/185.12, 185.17, 185.25, 185.28
See application file for complete search history.

(56) References Cited

U.S. PATENT DOCUMENTS

| 6,738,290 B2 * | 5/2004 | Lee et al. ............. 365/185.17 |
| 6,859,394 B2 * | 2/2005 | Matsunaga et al. .... 365/185.17 |
| 6,859,395 B2 * | 2/2005 | Matsunaga et al. .... 365/185.18 |
| 6,859,397 B2 * | 2/2005 | Lutze et al. ........... 365/185.28 |
| 6,956,769 B2 * | 10/2005 | Lee ...................... 365/185.09 |

* cited by examiner

*Primary Examiner*—Hoai V. Ho
(74) *Attorney, Agent, or Firm*—Marshall, Gerstein & Borun LLP

(57) ABSTRACT

Provided is directed to a NAND flash memory device and a method of programming the same, which can improve integration of the device by removing a common source line connecting with a source line coupled to a plurality of cell blocks, control a voltage applied to a source line by each cell block, and rise a precharge level in a channel area by applying a pumping voltage to the source line relatively having low capacitance instead of a bitline having a large capacitance, and as a result of those, the NAND flash memory device can reduce disturbance, use a lower voltage than a power supply voltage on the bitline, which leads to reduce a current consumption.

12 Claims, 5 Drawing Sheets

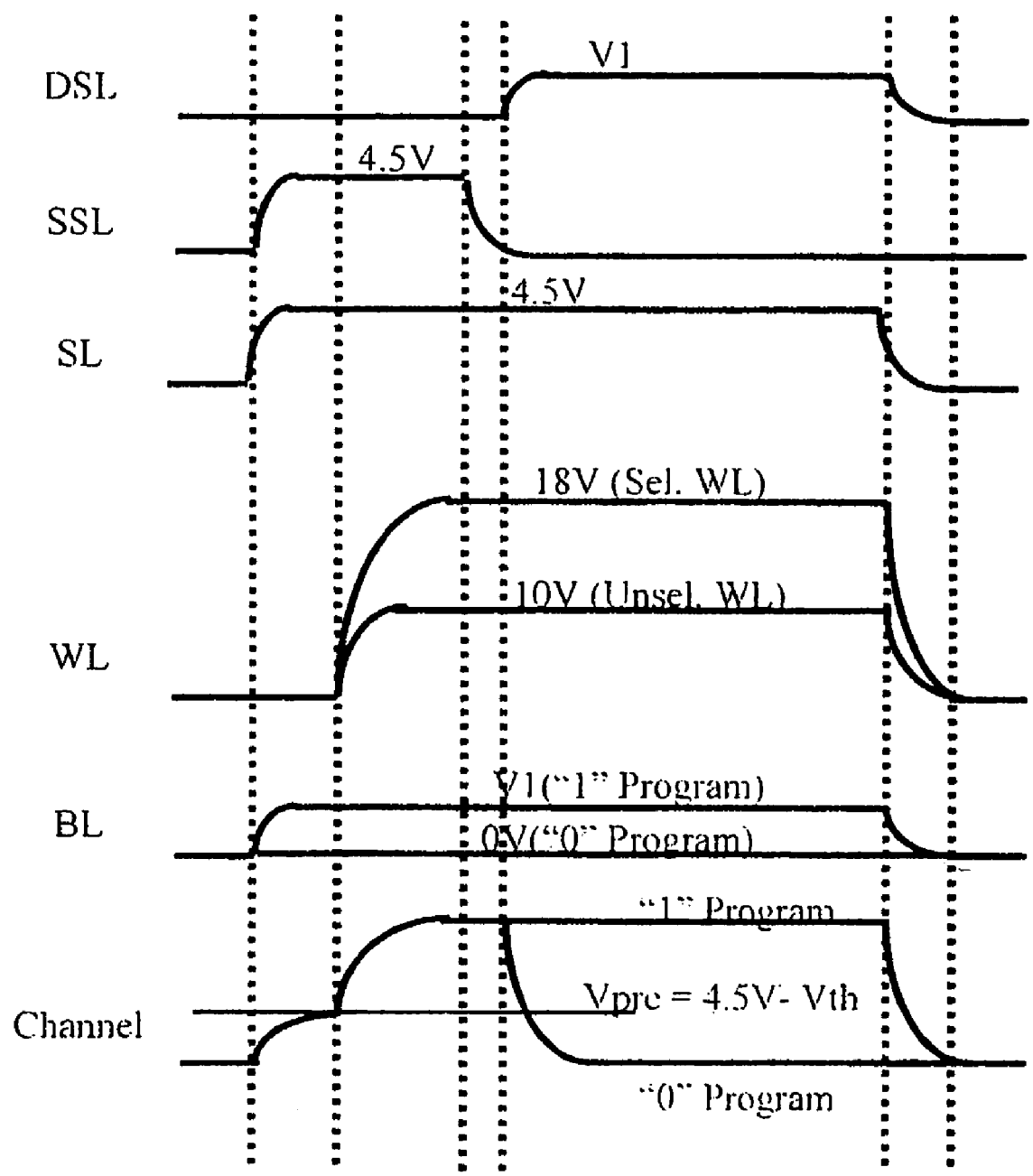

NAND FLASH MEMORY DEVICE AND METHOD OF PROGRAMMING THE SAME

BACKGROUND

1. Field of the Invention

The present invention relates to a NAND flash memory device and a method of programming the same, and more particularly to, a NAND flash memory device and a method of programming the same which can prevent a program disturbance of a NAND flash memory device by changing a common source line of the device.

2. Discussion of Related Art

In a NAND flash memory device, 0V is applied to a bitline in order to program '0', and Vcc is applied to a bitline in order to program '1'. During programming '1', a channel of a corresponding cell without programming is precharged to Vcc-Vth at first, and then can reduce a voltage difference between a gate and the channel by voltage rising according to an operation of self boosting. As a result, a cell is protected from being programmed. However, under 1.8V for a power supply voltage, a precharged voltage is lower. It makes the voltage difference between gate and channel more larger, which causes a problem that a cell gets a more program disturbance.

SUMMARY OF THE INVENTION

In order to solve aforementioned problems, the present invention is directed to provide a NAND flash memory device and a method of programming the same capable of rising a boosting level of a channel, by isolating each source line of a flash memory cell block, and controlling the each source line by a unit of block.

One aspect of the present invention is to provide a NAND flash memory device comprising; a plurality of cell blocks including a plurality of cell strings connected to a plurality of flash cells in series, and erasing according to a predetermined command signal, or programming a predetermined information on a selected cell, or reading an information of the selected cell; a plurality of source lines connected with the plurality of cell strings in the plurality of cell blocks respectively; and a source line selection unit for respectively applying a different voltage to the plurality of source lines.

Another aspect of the present invention is to provide a method of programming a NAND flash memory device which comprises the steps of: providing a NAND flash memory device including a plurality of cell blocks including a plurality of cell strings connected with a plurality of cells in series, a plurality of string select transistors connected with a drain terminal of the cell string, and a plurality of source select transistors connected with a source terminal of the cell string, a string select line connected with a gate terminal and a plurality of bitlines respectively coupled to drain terminals of the plurality of string select transistors, a source select line connected with a gate terminal and a source line coupled to the source terminals of the plurality of source select transistors, a word line connected with each gate terminal of the plurality of cell gates in the plurality of cell strings, and a source line selection unit applying a predetermined voltage to the source line; applying a string voltage to the string select line, applying a ground voltage to the source select line; applying a ground voltage to the word line, applying a ground voltage to the selected bitline, applying a pass voltage to the deselected bitline, and finally applying a power supply voltage to the source line through the source line selection unit; and performing a program operation by applying a program voltage to the selected word line, and applying a by-pass voltage to the deselected word line.

Furthermore, third aspect of the present invention is to provide another method of programming a NAND flash memory device which comprises the steps of: providing a NAND flash memory device including a plurality of cell blocks including a plurality of cell strings connected with a plurality of cells in series, a plurality of string select transistors connected with a drain terminal of the cell string, and a plurality of source select transistors connected with a source terminal of the cell string, a string select line connected with a gate terminal and a plurality of bitlines respectively coupled to drain terminals of the plurality of string select transistors, a source select line connected with a gate terminal and a source line coupled to the source terminals of the plurality of source select transistors, a word line connected with each gate terminal of the plurality of cell gates in the plurality of cell strings, and a source line selection unit applying a predetermined voltage to the source line; applying a ground power supply to the string select line, applying a pumping voltage to the source select line, applying a ground power supply to the selected bitline, applying a pass voltage to the deselected bitline, applying a program voltage to the selected word line, applying a by-pass voltage to the deselected word line, and finally applying a precharge voltage to the source line to the source line selection unit; applying a ground power supply to the source select line; and applying the pass voltage to the string select line.

Fourth aspect of the present invention is to provide another method of programming a NAND flash memory device which comprises the steps of: providing a NAND flash memory device including a plurality of cell blocks including a plurality of cell strings connected with a plurality of cell in series, a plurality of string select transistors connected with a drain terminal of the cell string, and a plurality of source select transistors connected with a source terminal of the cell string, a string select line connected with a gate terminal and a plurality of bitlines respectively coupled to drain terminals of the plurality of string select transistors, a source select line connected with a gate terminal and a source line coupled to the source terminals of the plurality of source select transistors, a word line connected with each gate terminal of the plurality of cell gates in the plurality of cell strings, and a source line selection unit applying a predetermined voltage to the source line; applying a ground power supply to the string select line, applying a pumping voltage to the source select line, applying a ground power supply to the selected bitline, applying a pass voltage to the deselected bitline, applying a ground power supply to the plurality of word lines, and applying a precharge voltage to the source line through the source line selection unit; applying a program voltage to the selected word line, and applying a by-pass voltage to the deselected word line; applying a ground voltage to the source select line; and applying the pass voltage to the string select line.

BRIEF DESCRIPTION OF THE DRAWINGS

FIG. 5 is a schematic diagram illustrating a method of programming a NAND flash memory device in accordance with a third embodiment of the present invention.

DETAILED DESCRIPTION OF PREFERRED EMBODIMENTS

Hereinafter, it will be described about embodiments of the present invention with reference to the accompanying drawings in detail.

Figure 1:
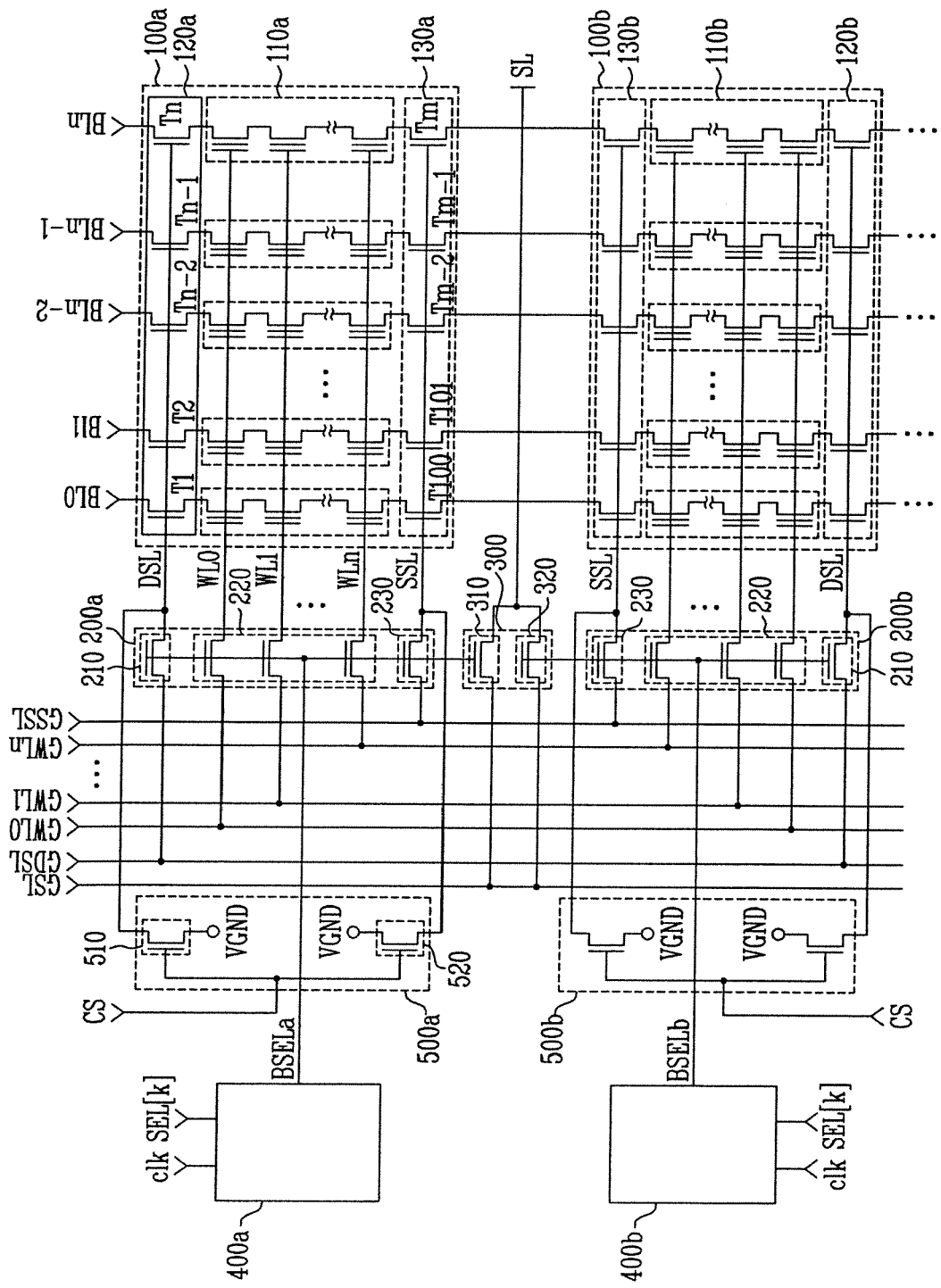
FIG. 1 is a circuit diagram illustrating a NAND flash memory device in accordance with the present invention.

FIG. 1 is a circuit diagram illustrating a NAND flash memory device in accordance with the present invention.

Referring to FIG. 1, the NAND flash memory device of the present invention is comprised of: a plurality of cell blocks 100 including a plurality of cell strings 10 connected with a plurality of flash cells in series, and erasing according to a predetermined control signal, or programming a predetermined information on the selected flash cell, or reading the selected cell information; a plurality of source lines SL respectively connected with the plurality of cell strings 10 in the plurality of cell blocks 100; and a source line selection unit 300 for applying a predetermined high voltage to the plurality of source lines SL, respectively. It can further include a X-decoder unit 200 transferring a predetermined control signal according to an operation voltage BSEL.

It will be described about the aforementioned flash memory device in more detail as follows.

The NAND flash memory device is comprised of: a plurality of cell blocks 100 arrayed to correspond a plurality of cell strings 110 to a plurality of bitlines BL0 to BLn, respectively, erased according to a local string select signal DSL, a local source select signal SSL, a plurality of local word lines WL0 to WLn, and a plurality of bitlines BL0 to BLn, or programming a predetermined information on the selected cell in the selected cell string 110, or reading the selected cell information; a plurality of X-decoder unit 200 for transferring a plurality of global signals to the plurality of cell blocks 100, respectively, as the local string select signal DSL, the local source select signal SSL, and the plurality of local word line signal WL0 to WLn, according to the operation voltage BSEL; a plurality of source lines SL connected with a common source terminal of each plural cell string 110 of the plurality of cell blocks; and a plurality of source line selection unit for applying a global common source signal GSL to the plurality of source lines SL, respectively, according to the operation voltage BSEL.

It is preferable in an embodiment of the present invention that two adjacent cell blocks 100a, 100b share one source line SL. Additionally, the present invention doesn't make a common source line connecting the conventional source line. That is, a common source line is not drawing in a cell array. Accordingly, the source line SL can be controlled with a cell block 100 unit by generating a global common source line signal GSL, and then applying it to each cell block 100a, 100b through the source line selection unit 300. The plurality of global signal denotes a global string select signal GDSL, a global source select signal GSSL, and a plurality of global word lines GWL0 to GWLn.

Moreover, the NAND flash memory device of the present invention can further comprise an operation voltage generation unit 400 for generating an operation voltage BSELn according to a clock signal CLK and a first control signal SEL[K] from the external. Also, the NAND flash memory device can further comprise a switch unit 500 for transferring a virtual ground signal VGND as the local string select signal DSL and the local source select signal SSL according to a second control signal CS. Further, it can further comprise a plurality of page buffer units (not shown) for storing a predetermined data to program on a cell in the selected cell block 100 by being respectively connected with a bitline BL.

The cell block 100 comprises: a string selection unit 120 for transferring a plurality of bitline signal according to the local string select signal DSL; a source selection unit 130 for transferring the source line signal SL according to the local source select signal SSL; and a cell string unit for storing a predetermined data according to the plurality of bitline signal BL, the source line signal SL, and the plurality of local word line signal WL0 to WLn. The string selection unit 120 includes a plurality of string select transistors T1 to Tn for transferring the bitline BL signal according to the local string select signal SL by being connected with the plurality of bitlines BL, respectively. The source selection unit 130 includes a plurality of source select transistors T100 to Tm for transferring the bitline BL signal according to the local source select signal SSL by being connected with he source line SL. The cell string unit includes a plurality of cell strings 110 respectively connecting the plurality of cells coupled in series between the plurality of string select transistors T1 to Tn and the plurality of source select transistors T100 to Tm. While this, a local word line WL is connected with each gate of the cell positioned on the identical area in the plurality of cell strings 110, and thus stores or erases a predetermined data according to the plurality of bitline signals, a common source line signal SSL, and the plurality of local word line signals WL0 to WLn.

The X-decoder unit 200 comprises: a string transfer transistor 210 for transferring each global string select signal GDSL as the local string select signal GDL according to the operation voltage BSEL; a source transfer transistor 230 for transferring the local source select signal SSL; and a plurality of word line transfer transistors 220 for transferring the plurality of global word line signal GWLO to GWLn as the plurality of local word line signals WL0 to WLn.

The source selection unit 300 comprises first and second source line transistors 310, 320 for applying the global common source line signal GSL to the source line according to different operation voltages BSELa, BSELb each other. The different operation voltages BSELa, BSELb denote that, of the two cell blocks 100a sharing the source line SL, a first operation voltage BSELa applied to a first X-decoder 200a connected with a first cell block 100a, and a second operation voltage BSELb applied to a second X-decoder 200b connected with a second cell block 100b.

The switch unit 500 comprises: a string discharge transistor 310 for transferring a virtual ground signal VGND as the local string select signal DSL according to a second control signal CS; and a source discharge transistor 320 for transferring the virtual ground signal VGND as the local source select signal SSL according to the second control signal CS. The switch unit 500 transfers the virtual ground signal VGND in a logic low as the local string select signal DSL and the local source select signal SSL to the deselected cell block 100 during programming or reading operation.

Figure 2:
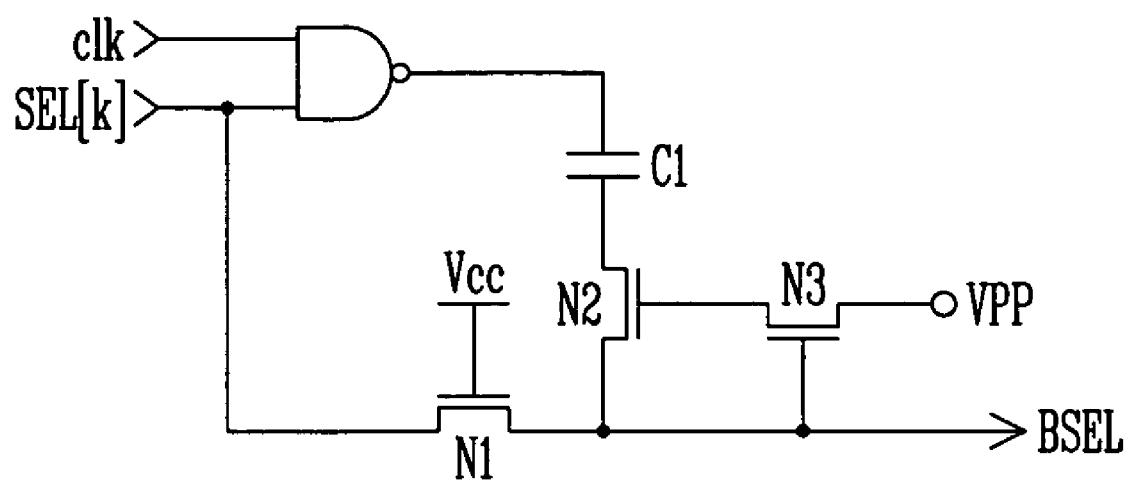
FIG. 2 is a circuit diagram illustrating an operation voltage generation unit in accordance with the present invention.

FIG. 2 is a circuit diagram illustrating an operation voltage generation unit in accordance with the present invention.

Referring to FIG. 2, an operation voltage generation unit 400 comprises: a NAND gate ND for logically combining the clock signal CLK and the first control signal SEL[K]; a first NMOS transistor N1 for precharging an output terminal of an operation voltage according to a power supply voltage; a capacitor C1 and a second NMOS transistor N2 connected in series between an output terminal of the NAND gate ND and the output terminal of the operation voltage; and a third NMOS transistor N3 connected between an input terminal of a pump voltage VPP and a gate terminal of the second NMOS transistor N2. In the present invention, it is preferable to use an operation voltage generation unit 400 generating a voltage Vth higher than a pumped voltage VPP. That is, it is possible to use a variable type circuit without limit of the operation voltage generation unit circuit having the aforementioned configuration.

It is preferable to use a NMOS transistor for the aforementioned plurality of string select transistors T1 to Tn and the plurality of source select transistors T100 to Tm. The first cell string of the plurality of cell strings 110 is connected with first transistors T1, T100 of the plurality of string select transistors T1 to Tn and the plurality of source select transistors T100 to Tm. The first cells of the plurality of cell strings 110 operate according to the first word line signal WL0. It is preferable to connect the cell numbers as many as 16 times 2 in series with the cell string. In the NAND flash memory device of the present invention, it is preferable to position the cell block 100 as many as 1024 times 2.

It is preferable to use a high voltage NMOS transistor capable of being operated by voltages of 1 to 28V, as the string transfer transistor 210, the source select transistor 230, the plurality of word line transfer transistors 220, and the first and the second source line transistor 310, 320. That is, it is efficient to use a transistor having a junction breakdown voltage over 20V. Additionally, it is also preferable to use a native high voltage transistor formed on a semiconductor substrate, which is not ion-implanted to the aforementioned transistor.

It is preferable to use a high voltage NMOS transistor or a general NMOS transistor as the string discharge transistor 510, the source discharge transistor 520, and the first and second source line transistors 310, 320.

In the present invention having the aforementioned configuration, it will now be described about a procedure for programming data in a predetermined cell in the selected cell block. During this, it will explained by denoting the selected cell block with 100a in FIG. 1 and the deselected cell block with 100b in FIG. 1.

Figure 3:
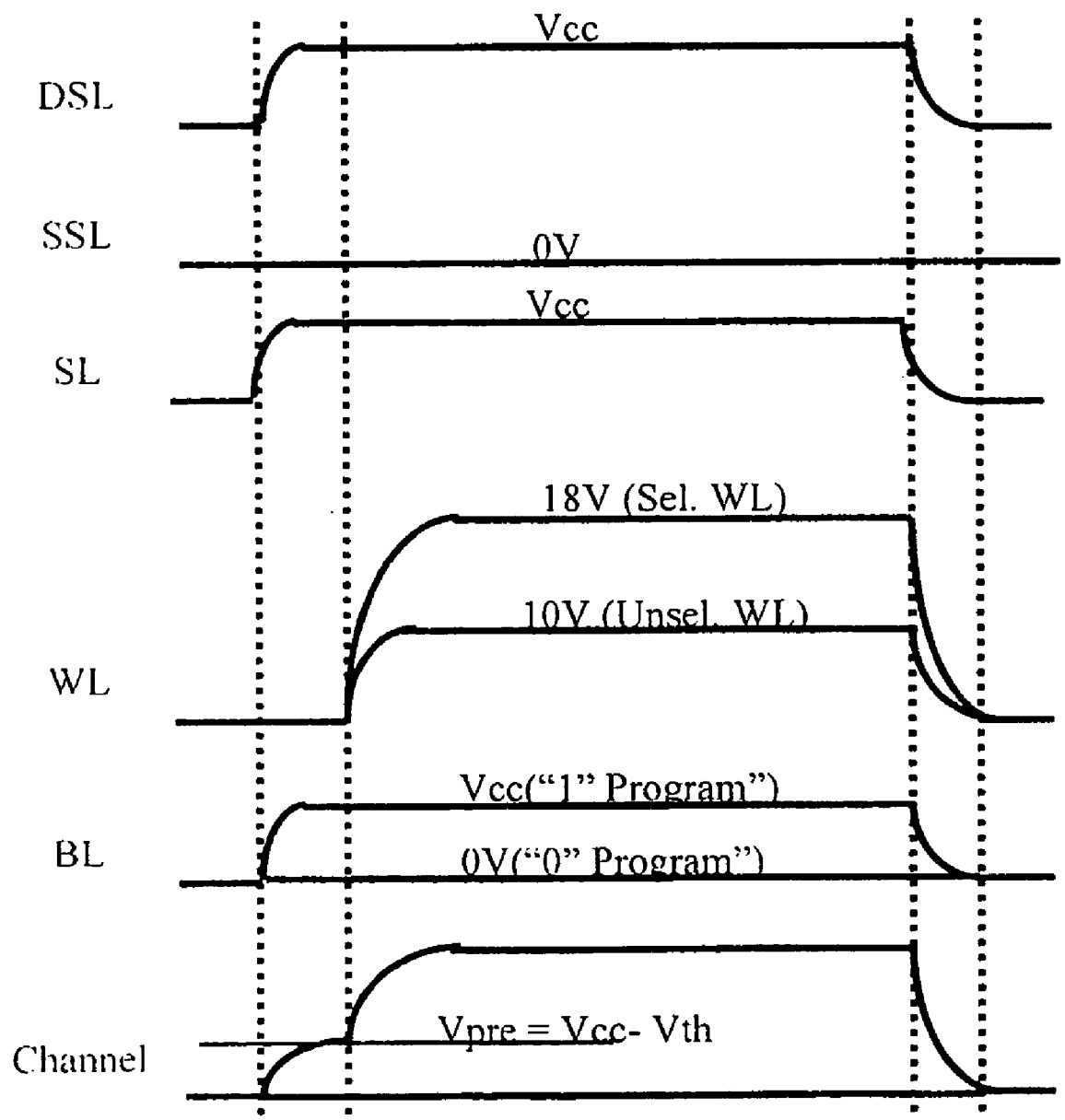
FIG. 3 is a schematic diagram illustrating a method of programming a NAND flash memory device in accordance with a first embodiment of the present invention.

FIG. 3 is a schematic diagram illustrating a method of programming the NAND flash memory device in accordance with a first embodiment of the present invention.

Referring to FIGS. 1 and 3, in a method of programming the NAND flash memory device, including: a plurality of cell blocks 100 having a plurality of cell strings 110 connected with a plurality of cell in series, a plurality of string select transistors T1 to Tn connected with a drain terminal of the cell string, and a plurality of source select transistors T100 to Tm connected with a source terminal of the cell string 110; a plurality of bitlines BL0 to BLn connected respectively with a drain terminal of the plurality of string select transistors T1 to Tn and a string select line DSL connected a gate terminal; a source line connected with a source terminal of the plurality of source select transistors T100 to Tm and a source select line SSL connected with the gate terminal; word lines WL0 to WLn connected with each gate terminal of the plurality of cell gates in the plurality of cell strings; and a source line selection unit 500 for applying a predetermined voltage to the source line SL, a method of programming the NAND flash memory device in accordance with the first embodiment of the present invention includes steps of: applying a string voltage to the local string select line DSL, applying a ground power source to the local source select line SSL, applying a ground voltage to the word line WL, applying a ground power supply to the selected bitline (BL: '0' Program), applying a pass voltage to the deselected bitline (BL: '1' Program), and applying a power supply voltage to the source line SL through the source line selection unit 300; and performing a programming operation by applying a program voltage to the selected word line Sel WL, and applying a by-pass voltage to the deselected word line Unsel WL.

The aforementioned power supply voltage preferably uses a voltage of 1.6 to 3.0V. A voltage of 17 to 19V is used for the program voltage, and a voltage of 9 to 11V is used for the by-pass voltage.

The flash memory device can further comprise: a X-decoder unit 200 for transferring a plurality of global signals as the local string select signal DSL, the local source select signal SSL, and the plurality of local word line signals WL0 to WLn according to the operation voltage BSEL; and a page buffer unit for storing a predetermined data to program on the cell in the selected cell block 100. Furthermore, in the aforementioned method of programming the device, it can include more steps which are performed before applying string voltage to the local string select line DSL, applying a ground power supply to the local source select line SSL, applying a ground voltage to the word line WL, applying a ground power supply to the selected bitline BL, applying a pass voltage to the deselected bitline BL, and applying a power supply voltage to the source line SL through the source line selection unit 300, such as: selecting a bitline BL and a word line WL in response to inputting a cell information which can be programmed by an external address; and enabling the source line selection unit 300 and the X-decoder 200 connected with the cell block 100 including the cell to be programmed, and storing data to be programmed in a page buffer.

It will be described about the method of programming in accordance with the aforementioned first embodiment in detail as follows.

When the ground power supply is applied to the bitline (BL: '0' Program) selected through the page buffer, the ground voltage is applied to another bitline (BL: '1' Program) which will not be selected. The ground voltage is applied to the local string select line DSL through the X-decoder unit 200, the ground power supply is applied to the local source select line SSL, and the ground voltage is applied to the word line WL. As a result, the local string select transistors T1 to Tn connected with the local string select line DSL are turned on and a channel area of the cell string 110 is precharged to a voltage up to Vcc-Vth through a power supply voltage applied to the bitline BL. Accordingly, the channel area maintains 0 potential according to the ground voltage.

Then, the selected word line Sel WL is applied with 18V, while the deselected word line Unsel WL is applied with 10V. As a result of this, the channel of the cell string without being programmed (applied with a power supply voltage) is not programmed because of being self boosting. Additionally, although the channel which will be programmed maintains a ground power supply, there is only small difference of voltages between the channel of the cell connected with the deselected word line Unsel WL and a gate, which leads not to be programmed. Thus, the cell connected with the selected word line Sel WL has a large difference of voltages between the channel and the gate, which leads to be performed for programming it.

Figure 4:
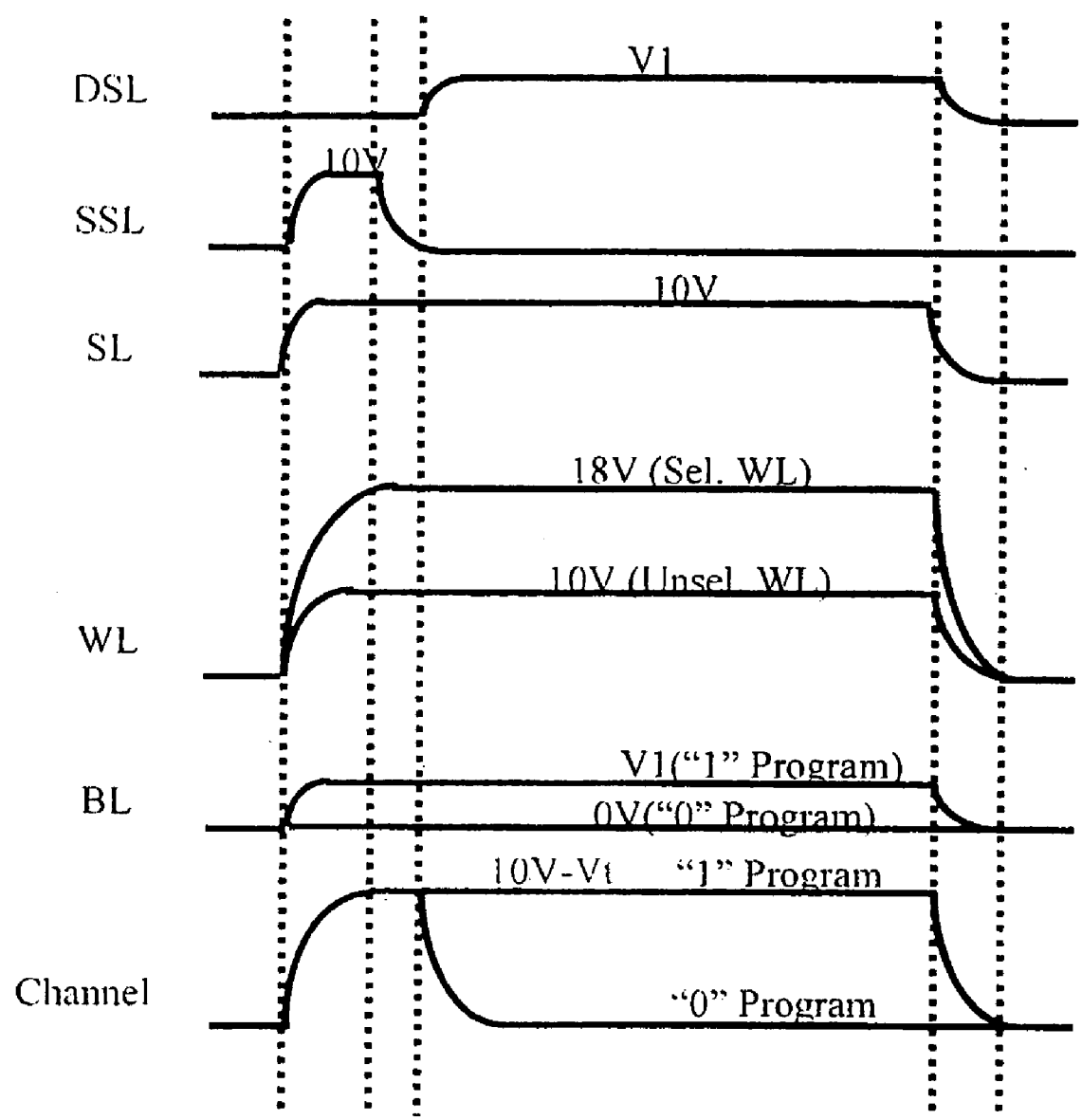
FIG. 4 is a schematic diagram illustrating a method of programming a NAND flash memory device in accordance with a second embodiment of the present invention.

FIG. 4 is a schematic diagram illustrating a method of programming a NAND flash memory device in accordance with a second embodiment of the present invention.

Referring to FIGS. 1 and 4, in a method of programming the NAND flash memory device, including: a plurality of cell blocks 100 having a plurality of cell strings 110 connected with a plurality of cell in series, a plurality of string select transistors T1 to Tn connected with a drain terminal of the cell string, and a plurality of source select transistors T100 to Tm connected with a source terminal of the cell string 110; a plurality of bitlines BL0 to BLn connected respectively with a drain terminal of the plurality of string select transistors T1 to Tn and a string select line DSL connected a gate terminal; a source line connected with a source terminal of the plurality of source select transistors T100 to Tm and a source select line SSL connected with the gate terminal; word lines WL0 to WLn connected with each gate terminal of the plurality of cell gates in the plurality of cell strings; and a source line selection unit 500 for applying a predetermined voltage to the source line SL, a method of programming the NAND flash memory device in accordance with the second embodiment of the present invention includes the steps of: applying the ground power supply to the local string select line DSL, applying a pumping voltage to the local source select line SSL, applying the ground power supply to the selected bitline (BL: '0' Program), applying a pass voltage to the deselected bitline (BL: '1' Program), applying a program voltage to the selected word line Sel WL, applying a by-pass voltage to the deselected word line Unsel WL, and applying the precharge voltage to the source line SL through the source line selection unit 300; applying a ground power voltage to the local source select line SSL; and applying a pass voltage to the local string select line DSL.

A voltage of 9 to 13V is used for the pumping or precharge voltage. Preferably, the pass voltage uses a voltage higher than a threshold voltage of the string select transistors T1 to Tn, and lower then or identical to the power supply voltage. The power supply voltage preferably uses a voltage of 1.6 to 3.0V. A voltage of 17 to 19V is used for the program voltage, and a voltage of 9 to 11V is used for the by-pass voltage, preferably.

The flash memory device can further comprise: a X-decoder unit 200 for transferring a plurality of global signals as the local string select signal DSL, the local source select signal SSL, and the plurality of local word line signals WL0 to WLn according to the operation voltage BSEL; and a page buffer unit for storing a predetermined data to program on the cell in the selected cell block 100. Furthermore, the method of programming the device can further includes more steps, before applying the pumping voltage to the local source select line SSL, applying a ground power supply to the selected bitline (BL: '0' Program), applying the pass voltage to the deselected bitline (BL: '1' Program), applying a program voltage to the selected word line Sel WL, applying the by-pass voltage to the deselected word line Unsel WL, and applying the precharge voltage to the source line SL through the source line selection unit 300, such as: selecting a bitline BL and a word line WL in response to inputting a cell information which can be programmed by an external address; and enabling the source line selection unit 300 and the X-decoder 200 connected with the cell block 100 including the cell to be programmed, and storing data to be programmed in a page buffer.

It will now be described about a method of programming in accordance with the second embodiment of the present invention.

The ground power source is applied to the selected bitline (BL: '0' Program), and the pass voltage is applied to the deselected bitline (BL: '1' Program). The ground power source is applied to the local string select line DSL through the X-decoder 200. The local source select line SSL is applied with 10V, the selected word line Sel WL is applied with 18V, and the deselected word line Unsel WL is applied with 10V. The source line SL is applied with a voltage of 10V through the source line selection unit 200.

As a result, the channel voltage is rising to a predetermined voltage level. That is, the local source select transistors T1 to Tn are turned on, and the channel area of the cell strings 110 of the whole cell blocks is precharged to a voltage up to 10V-Vth through a 10V voltage applied to the source line SL. During this, Vth denotes a threshold voltage of the local source select transistors when all the cell is a erased cell and it is preferable to denote a threshold voltage of a program cell when there is the program cell. At the moment, the string select transistors T100 to Tn and the cell are all turned off. Gradually, a voltage of 10V or 18V is applied to the gate of the cell.

After precharging the channel voltage to a predetermined voltage level, the voltage of the local source select line SSL is discharged. As a result, the local source select transistors T100 to Tm are turned off. Then, the pass voltage is applied to the local string select line DSL through the X-decoder 300.

Accordingly, the string select transistor DSL is turned on, and thus the channel voltage of the cell string 110 connected with the selected bitline (BL: '0' Program) falls down to 0V. In response to this, the difference of voltages between the gate of the cell and the channel maintains 18V, which results in that the cell connected with the selected word line Sel WL is programmed. However, the difference of voltages between the gate of the cell and the channel maintains 10V, which results in that the cell connected with the deselected word line is not programmed. Furthermore, the channel voltage of the cell string connected with the deselected bitline (BL: '1' Program) maintains not to be programmed. It is available in the embodiment to apply a voltage higher than 10V in the channel area through the source line SL. As a result, it is advantageous to reduce disturbance which the cell gets.

FIG. 5 is a schematic diagram illustrating a method of programming a NAND flash memory device in accordance with a third embodiment of the present invention.

Referring to FIGS. 1 and 5, in a method of programming the NAND flash memory device, including: a plurality of cell blocks 100 having a plurality of cell strings 10 connected with a plurality of cells in series, a plurality of string select transistors T1 to Tn connected with a drain terminal of the cell string, and a plurality of source select transistors T100 to Tm connected with a source terminal of the cell string 110; a plurality of bitlines BL0 to BLn connected respectively with a drain terminal of the plurality of string select transistors T1 to Tn and a string select line DSL connected a gate terminal; a source line connected with a source terminal of the plurality of source select transistors T100 to Tm and a source select line SSL connected with the gate terminal; word lines WL0 to WLn connected with each gate terminal of the plurality of cell gates in the plurality of cell strings; and a source line selection unit 500 for applying a predetermined voltage to the source line SL, a method of programming the NAND flash memory device in accordance with the third embodiment of the present invention includes the steps of: applying the ground power source to the local string select line DSL, applying a pumping voltage to the local source select line SSL, applying the ground power source to the selected bitline BL, applying a pass voltage to the deselected bitline BL, applying the ground power source, and applying the precharge voltage to the source line SL through the source line selection unit 300; applying the program voltage to the selected word line Sel WL, and applying the by-pass voltage to the deselected word line Unsel WL; applying the ground power source to the local source select line SSL; and applying the pass voltage to the local string select line DSL.

The pumping voltage and the precharge voltage preferably use a voltage of 3 to 6V. The pass voltage preferably uses a voltage higher than the threshold voltage of the string select transistor, and lower than or identical to the power supply voltage. The power supply voltage preferably uses a voltage of 1.6 to 3.0V. Preferably, the program voltage uses a voltage of 17 to 19V, and the by-pass voltage uses a voltage of 9 to 1 V.

The flash memory device can further comprise: a X-decoder unit 200 for transferring a plurality of global signals as the local string select signal DSL, the local source select signal SSL, and the plurality of local word line signals WL0 to WLn according to the operation voltage BSEL; and a page buffer unit for storing a predetermined data to program on the cell in the selected cell block 100. Furthermore, the method of programming the device can further includes more steps, before applying the pumping voltage to the local source select line SSL, applying a ground voltage to the selected bitline (BL: '0' Program), applying the pass voltage to the deselected bitline (BL: '1' Program), applying a program voltage to the selected word line Sel WL, applying the by-pass voltage to the deselected word line Unsel WL, and applying the precharge voltage to the source line SL through the source line selection unit 300, such as: selecting a bitline BL and a word line WL in response to inputting a cell information which can be programmed by an external address; and enabling the source line selection unit 300 and the X-decoder 200 connected with the cell block 100 including the cell to be programmed, and storing data to be programmed in a page buffer.

It will be described about the method of programming in accordance with the aforementioned third embodiment of the present invention in detail as follows.

The ground voltage is applied to the selected bitline (BL: '0' Program) through the page buffer, and the pass voltage is applied to the deselected bitline (BL: '1' Program). The ground voltage is applied to the local string select line DSL through the X-decoder 200. The local source select line SSL is applied with 4.5V, and the word line WL is applied with 0V. The source line SL is applied with a voltage of 4.5V through the source line selection unit 300.

As a result, the channel voltage is risen to a predetermined voltage level. That is, the local source select transistors T100 to Tm are turned on, and the channel area of the cell strings 110 of the whole cell blocks 100 is precharged to a voltage up to 4.5V-Vth through a 4.5V voltage applied to the source line SL. During this, Vth denotes a threshold voltage of the local source select transistors T100 to Tm. At the moment, the string select transistors T1 to Tn are all turned off.

Then, the selected word line Sel WL is applied with 18V, while the deselected word line Unsel WL is applied with 10V. As a result of this, the channel voltage is rising by boosting. After precharging the local source select line SSL, the same voltage to the voltage applied to the selected bitline (BL: '0' Program) is applied to the local string select line DSL.

Accordingly, the string select transistors T1 to Tn are turned on, and thus the channel voltage of the cell string 110 connected with the selected bitline (BL: '0' Program) falls down by 0V. In response to this, the difference of voltages between the gate of the cell and the channel maintains 18V, which results in that the cell connected with the selected word line Sel WL is programmed. However, the difference of voltages between the gate of the cell and the channel maintains 10V, which results in that the cell connected with the deselected word line is not programmed. Furthermore, the channel voltage of the cell string connected with the deselected bitline (BL: '1' Program) maintains not to be programmed. It is available in the embodiment to apply a voltage higher than 4.5V in the channel area through the source line SL. As a result, it is advantageous to reduce disturbance in cells.

The present invention can raise a precharge level by applying the pumping voltage to the source line having a relatively small capacitance instead of a bitline which has a large capacitance. If pumping value capable of boosting the source line of one block in the present invention, it is possible to get an sufficient boosting voltage level. It is also usable for a lower voltage instead of the conventional power supply voltage on a bitline. Furthermore, it can result to reduce a current consumption of the overall device.

As aforementioned, the present invention can improve an integration of device by erasing a common source line connecting the source line coupled to a plurality of cell blocks.

Also, the present invention can control a voltage applied to the source line by each cell block.

Furthermore, it can raise the precharge level in the channel area by applying the pumping voltage to the source line having a relatively small capacitance instead of the bitline having a large capacitance.

Additionally, it can reduce a current consumption as possibly using a voltage lower than the power supply voltage to the bitline.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A NAND flash memory device, comprising:
    a plurality of cell blocks including a plurality of cell strings having a plurality of flash cells, wherein the flash cells are erased according to a predetermined command signal, or selected flash cells are programmed according to a predetermined information;
    a plurality of source lines connected with the plurality of cell strings in the plurality of cell blocks respectively;
    a source line selection unit to transfer a predetermined voltage to the source line of a selected cell block and to prevent the transfer of the predetermined voltage to the source line of a non-selected cell block, according to an operation voltage to select one of the cell blocks.

2. The NAND flash memory device of claim 1, further comprising a X-decoder for transferring a command signal including a local string select signal, a plurality of local word line signals and a local source select signal in response to the operation voltage; and wherein the source line selection unit comprises a source line transistor for transferring the predetermined voltage as a global common source line signal to the source line of the selected cell block, respectively, according to the operation voltage.

3. The NAND flash memory device of claim 2, the X-decoder comprises:

a string transfer transistor for transferring each global string select signal as the local string select signal according to an operation voltage;

a source transfer transistor for transferring each global source select signal as the global source select signal as the local source select signal; and a plurality of word line transfer transistors for transferring the plurality of global word line signals as the plurality of local word line signals.

4. The NAND flash memory device of claim 1, further comprising: a switch unit including a string discharge transistor and a source discharge transistor for respectively transferring a virtual ground signal to a drain terminal of the cell string and a source terminal according to a control signal.

5. The NAND flash memory device of claim 1, two adjacent blocks of the plurality of cell blocks share a source line.

6. The NAND flash memory device of claim 1, the cell block comprises:

a plurality of string select transistors for transferring a bitline signal by being connected with a plurality of bitlines;

a plurality of source select transistors for transferring a source line signal by being connected to the source line; and the plurality of cell strings respectively connecting a plurality of cells coupled in series between the plurality of string select transistors and the plurality of source select transistors, wherein the local word line is connected with each gate of the cells positioned on the identical area in the plurality of cell strings, and thus storing or erasing a predetermined data according to the plurality of bitline signals, the source line signal and the plurality of local word line signals.

7. A method of programming the NAND flash memory device, comprising steps of:

providing a NAND flash memory device including a plurality of cell blocks including a plurality of cell strings to which a plurality of cells are connected in series, a plurality of string select transistors connected with a drain terminal of the cell string, and a plurality of source select transistors connected with a source terminal of the cell string, a string select line connected with a gate terminal and a plurality of bitlines respectively coupled to drain terminals of the plurality of string select transistors, a source select line connected with a gate terminal and a source line coupled to the source terminals of the plurality of source select transistors, a word line connected with each gate terminal of the plurality of cell gates in the plurality of cell strings, and a source line selection unit comprises a source line transistor for transferring a predetermined voltage as a global common source line signal to the source line of a selected cell block and to prevent the transfer of the predetermined voltage to the source line of a non-selected cell block, according to an operation voltage to select one of the cell blocks;

applying a string voltage to the string select line, applying a ground power supply to the source select line; applying a ground voltage to the word line, applying a ground power supply to the selected bitline, applying a pass voltage to the deselected bitline, and finally applying a power supply voltage to the source line through the source line selection unit; and performing a program operation by applying a program voltage to the selected word line, and applying a by-pass voltage to the deselected word line.

8. The method of programming the NAND flash memory device of claim 7, the power supply voltage uses a voltage of 1.6 to 3.0V, the string voltage and the pass voltage use the power supply voltage, the program voltage uses a voltage of 17 to 19V, and the by-pass voltage uses a voltage of 9 to 11V.

9. A method of programming the NAND flash memory device, comprising the steps of:

providing a NAND flash memory device including a plurality of cell blocks including a plurality of cell strings connected with a plurality of cells in series, a plurality of string select transistors connected with a drain terminal of the cell string, and a plurality of source select transistors connected with a source terminal of the cell string, a string select line connected with a gate terminal and a plurality of bitlines respectively coupled to drain terminals of the plurality of string select transistors, a source select line connected with a gate terminal and a source line coupled to the source terminals of the plurality of source select transistors, a word line connected with each gate terminal of the plurality of cell gates in the plurality of cell strings, and a source line selection unit applying a predetermined voltage to the source line;

applying a ground voltage to the string select line, applying a pumping voltage to the source select line, applying a ground voltage to the selected bitline, applying a pass voltage to the deselected bitline, applying a program voltage to the selected word line, applying a by-pass voltage to the deselected word line, and finally applying a precharge voltage to the source line to the source line selection unit;

applying a ground power supply to the source select line; and applying the pass voltage to the string select line.

10. The method of programming the NAND flash memory device of claim 9, the pumping voltage and the precharge voltage use a voltage 9 to 13V, the program voltage uses a voltage 17 to 19V, the by-pass voltage uses a voltage of 9 to 11V, and the pass voltage uses a voltage higher than the threshold voltage of the string select transistor and lower than or identical to the power supply voltage.

11. A method of programming the NAND flash memory device, comprising the steps of:

providing a NAND flash memory device including a plurality of cell blocks including a plurality of cell strings connected with a plurality of cell in series, a plurality of string select transistors connected with a drain terminal of the cell string, and a plurality of source select transistors connected with a source terminal of the cell string, a string select line connected with a gate terminal and a plurality of bitlines respectively coupled to drain terminals of the plurality of string select transistors, a source select line connected with a gate terminal and a source line coupled to the source terminals of the plurality of source select transistors, a word line connected with each gate terminal of the plurality of cell gates in the plurality of cell strings, and a source line selection unit applying a predetermined voltage to the source line;

applying a ground voltage to the string select line, applying a pumping voltage to the source select line, applying a ground voltage to the selected bitline, applying a pass voltage to the deselected bitline, applying a ground voltage to the plurality of word lines, and applying a precharge voltage to the source line through the source line selection unit;

applying a program voltage to the selected word line, and applying a by-pass voltage to the deselected word line;

applying a ground voltage to the source select line; and applying the pass voltage to the string select line.

12. The method of programming the NAND flash memory device of claim 11, the pumping voltage and the precharge voltage use a voltage of 3 to 6V, the program voltage uses a voltage of 17 to 19V, the by-pass voltage uses a voltage 9 to 11V, the pass voltage uses a voltage higher than the threshold voltage of the string select transistor, and lower than or identical to the power supply voltage, and the power supply voltage uses a voltage of 1.6 to 3.0V.

* * * * *

UNITED STATES PATENT AND TRADEMARK OFFICE
CERTIFICATE OF CORRECTION

PATENT NO. : 7,212,439 B2 Page 1 of 1
APPLICATION NO. : 10/888067
DATED : May 1, 2007
INVENTOR(S) : Jin S. Park It is certified that error appears in the above-identified patent and that said Letters Patent is hereby corrected as shown below:

In the Claims:

At Column 10, line 65 claim 1, "blocks." should be -- blocks; and
wherein the source line selection unit comprises a source line transistor for transferring the predetermined voltage as a global common source line signal to the source line of the selected cell block, respectively, according to the operation voltage. --.

At Column 11, lines 3-8 claim 2, "voltage; and
wherein the source line selection unit comprises a source line transistor for transferring the predetermined voltage as a global common source line signal to the source line of the selected cell block, respectively, according to the operation voltage." should be -- voltage. --.

Signed and Sealed this

Twentieth Day of November, 2007

JON W. DUDAS
*Director of the United States Patent and Trademark Office*